United States Patent
Lin et al.

(10) Patent No.: US 12,416,451 B2
(45) Date of Patent: Sep. 16, 2025

(54) MULTI-LOOP CYCLING HEAT DISSIPATION MODULE

(71) Applicant: Acer Incorporated, New Taipei (TW)

(72) Inventors: Yu-Ming Lin, New Taipei (TW);
Wen-Neng Liao, New Taipei (TW);
Cheng-Wen Hsieh, New Taipei (TW);
Chun-Chieh Wang, New Taipei (TW);
Tsung-Ting Chen, New Taipei (TW);
Chi-Tai Ho, New Taipei (TW);
Kuan-Lin Chen, New Taipei (TW);
Jau-Han Ke, New Taipei (TW)

(73) Assignee: Acer Incorporated, New Taipei (TW)

( * ) Notice: Subject to any disclaimer, the term of this patent is extended or adjusted under 35 U.S.C. 154(b) by 389 days.

(21) Appl. No.: 17/711,069

(22) Filed: Apr. 1, 2022

(65) Prior Publication Data
US 2022/0325962 A1 Oct. 13, 2022

(30) Foreign Application Priority Data
Apr. 7, 2021 (TW) .................................. 110112549

(51) Int. Cl.
*F28D 15/02* (2006.01)
*F28D 15/04* (2006.01)

(52) U.S. Cl.
CPC ..... *F28D 15/0266* (2013.01); *F28D 15/0275* (2013.01); *F28D 15/046* (2013.01)

(58) Field of Classification Search
CPC . F28D 15/0266; F28D 15/0275; F28D 15/046
See application file for complete search history.

(56) References Cited

U.S. PATENT DOCUMENTS

| | | | |
|---|---|---|---|
| 2012/0024499 A1* | 2/2012 | Chang | F28F 13/06 165/104.34 |
| 2019/0017749 A1 | 1/2019 | Kurashima | |
| 2020/0064077 A1* | 2/2020 | Machida | F28D 15/0233 |

FOREIGN PATENT DOCUMENTS

| | | |
|---|---|---|
| CN | 108172558 | 6/2018 |
| TW | M534957 | 1/2017 |

\* cited by examiner

*Primary Examiner* — Jianying C Atkisson
*Assistant Examiner* — Khaled Ahmed Ali Al Samiri
(74) *Attorney, Agent, or Firm* — JCIPRNET

(57) ABSTRACT

A multi-loop cycling heat dissipation module including a first tank, a first pipe, a second tank, and a second pipe is provided. The first pipe is connected to the first tank to form a first loop, a first working fluid fills the first loop to transfer heat via phase transformation, and a first high-temperature section and a first low-temperature section are formed on the first pipe. The second pipe is connected to the second tank to form a second loop, a second working fluid fills the second loop to transfer heat via phase transformation, and a second high-temperature section and a second low-temperature section are formed on the second pipe. The first high-temperature section is in thermal contact with the second low-temperature section, and the first low-temperature section is in thermal contact with the second high-temperature section.

4 Claims, 4 Drawing Sheets

MULTI-LOOP CYCLING HEAT DISSIPATION MODULE

CROSS-REFERENCE TO RELATED APPLICATION

This application claims the priority benefit of Taiwan application serial no. 110112549, filed on Apr. 7, 2021. The entirety of the above-mentioned patent application is hereby incorporated by reference herein and made a part of this specification.

BACKGROUND

Technical Field

The disclosure relates to a heat dissipation module, and particularly relates to a multi-loop cycling heat dissipation module.

Description of Related Art

Along with advancement of science and technology, portable electronic apparatuses, such as notebook computers, tablet PCs, or smart phones, are developed toward a trend of lightness and thinness. The light and thin appearances have made these electronic apparatuses be ideal for users to carry and operate. Furthermore, in order to improve processing efficiency of tablet PCs, performance of central processing units of motherboards is improved as well. Nevertheless, such improvement often leads to generation of a large amount of heat and thereby causes crashes of circuits or electronic devices of an electronic apparatus as affected by overheating, and an inconvenient using experience is provided as a result.

Generally, the heat dissipation modules arranged in the electronic apparatuses include air-cooled heat dissipation modules and water-cooled heat dissipation modules. The water-cooled heat dissipation modules are more efficient. However, under the design and development trend of the aforementioned portable electronic apparatuses toward lightness, thinness, shortness, and compactness, how to arrange the corresponding heat dissipation module in an apparatus body with limited space while maintaining its heat dissipation efficiency is an important issue.

SUMMARY

The disclosure is directed to a multi-loop cycling heat dissipation module providing improved overall heat dissipation capacity.

The disclosure provides a multi-loop cycling heat dissipation module including a first tank, a first pipe, a second tank, and a second pipe. The first pipe is connected to the first tank to form a first loop. A first working fluid fills the first loop to transfer heat via phase transformation, and a first high-temperature section and a first low-temperature section are formed on the first pipe. The second pipe is connected to the second tank to form a second loop. A second working fluid fills the second loop to transfer heat via phase transformation, and a second high-temperature section and a second low-temperature section are formed on the second pipe. The first high-temperature section is in thermal contact with the second low-temperature section, and the first low-temperature section is in thermal contact with the second high-temperature section.

Based on the above description, the heat dissipation module is formed by a multi-loop cycling arrangement and is filled with corresponding working fluids, so that these loops are independent single loops. More importantly, in the independent loops, the heat dissipation module of the disclosure further combines the high-temperature sections and the low-temperature sections of the pipes by means of thermal contact. Accordingly, the high-temperature section of one loop may further transfer heat to the low-temperature section of another loop, a temperature equalization effect is thereby provided to the entire heat dissipation module, and the overall heat dissipation capacity of the heat dissipation module is effectively improved. In other words, by slowing down a temperature dropping degree of a single loop and providing an additional heat dissipation path, the overall heat dissipation performance of the heat dissipation module is improved accordingly, such that the heat generated by a heat source of an electronic apparatus is quickly transferred to an external environment, and heat is prevented from accumulating on a local part of the electronic apparatus.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
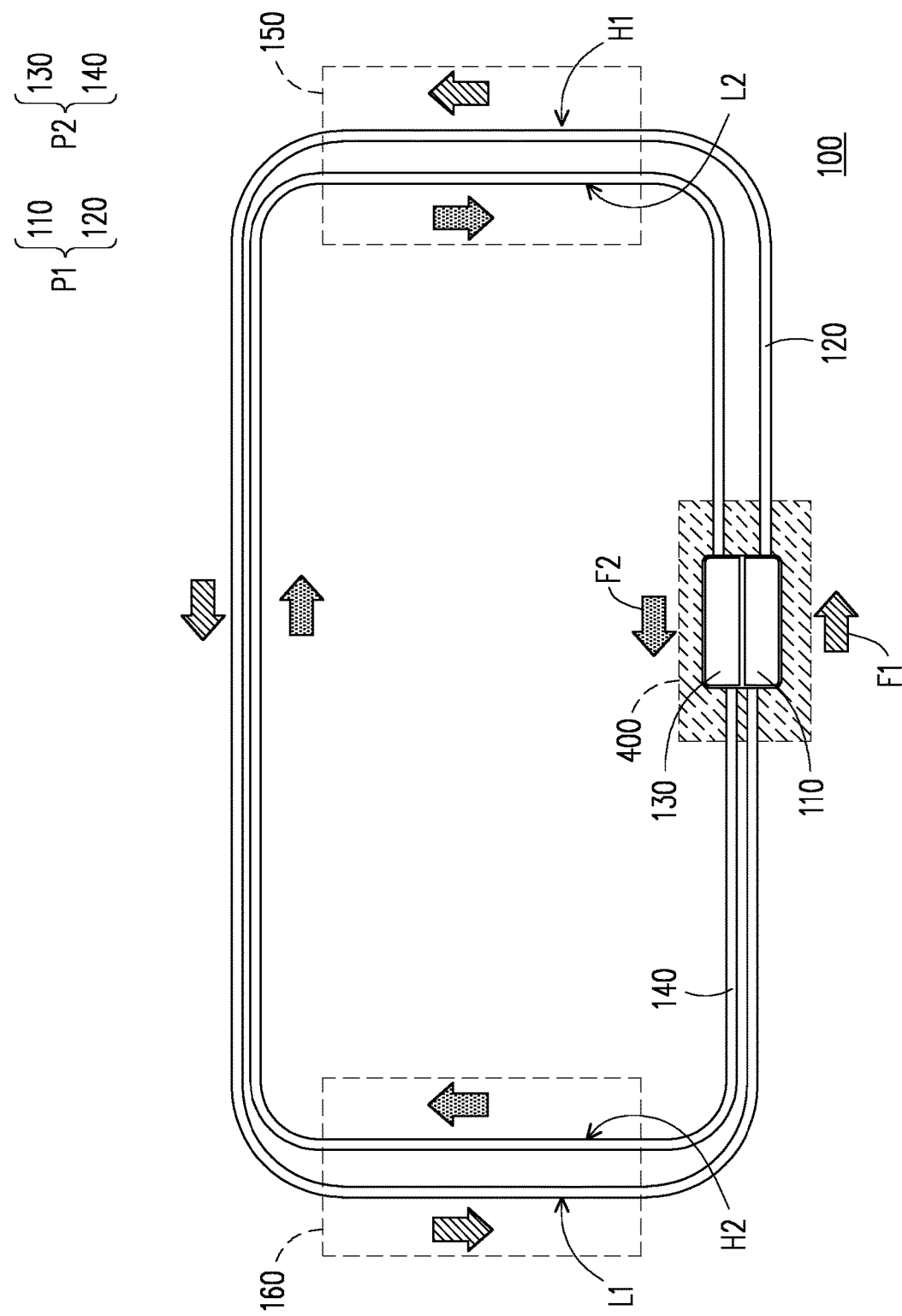
FIG. 1 is a schematic diagram of a multi-loop cycling heat dissipation module according to an embodiment of the disclosure.

FIG. 1 is a schematic diagram of a multi-loop cycling heat dissipation module according to an embodiment of the disclosure. Referring to FIG. 1, arrows shown next to loops act as a simple illustration of working fluids filling the loops. In this embodiment, a multi-loop cycling heat dissipation module 100 includes a first tank 110, a first pipe 120, a second tank 130, and a second pipe 140. The first pipe 120 is connected to the first tank 110 to form a first loop P1. A first working fluid F1 fills the first loop P1 to transfer heat via phase transformation. A first high-temperature section H1 and a first low-temperature section L1 are formed on the first pipe 120. The second pipe 140 is connected to the second tank 130 to form a second loop P2. A second working fluid F2 fills the second loop P2 to transfer heat via phase transformation. A second high-temperature section H2 and a second low-temperature section L2 are formed on the second pipe 140. The first high-temperature section H1 is in thermal contact with the second low-temperature section L2, and the first low-temperature section L1 is in thermal contact with the second high-temperature section H2.

Further, the multi-loop cycling heat dissipation module 100 is suitable to be disposed in an electronic apparatus (e.g., a notebook computer or a tablet computer) to dissipate heat of a heat source 400 (e.g., a central processing unit or a display chip). The first tank 110 and the second tank 130 of this embodiment are in thermal contact with the heat source 400 to absorb heat generated by the heat source 400 and cause phase transformation (transition from a liquid phase to a vapor phase) of the first working fluid F1 and the second working fluid F2 respectively in the first tank 110 and the second tank 130. In this way, the first working fluid F1 and the second working fluid F2 in the vapor phase respectively flow out of the first tank 110 and the second tank 130, gradually dissipate heat and are transformed into the liquid phase during a travelling process in the first pipe 120 and the second pipe 140, and accordingly flow back to the first tank 110 and the second tank 130 respectively to form a phase transformation cycle. As such, either the first loop P1 or the second loop P2 may provide the heat source 400 with a heat dissipation effect. Regarding the first loop P1, the first working fluid F1 located in the first high-temperature section H1 is in the vapor phase, the first working fluid F1 located in the first low-temperature section L1 is in the liquid phase, and a liquid and vapor coexisting state exists therebetween. Regarding the second circuit P2, the second working fluid F2 in the second high-temperature section H2 is in the vapor phase, the second working fluid F2 in the second low-temperature section L2 is in the liquid phase, and the liquid and vapor coexisting state exits therebetween.

It should be noted that if the first loop P1 and the second loop P2 are considered separately, the temperature of the first low-temperature section L1 and the temperature of the second low-temperature section L2 are substantially close to an ambient temperature. In the case of a small temperature difference, an overall heat dissipation effect of such position is significantly reduced. In other words, if only the first loop P1 or only the second loop P2 is provided, overall heat dissipation performance may only depend on the phase transformation of the first working fluid F1 in the first pipe 120 or the phase transformation of the second working fluid F2 in the second pipe 140, a performance bottleneck is thus generated in the current loop-type cycling heat dissipation module.

In view of the above reason, this embodiment further combines the first loop P1 and the second loop P2 that are different from each other to form a thermal contact zone in the first high-temperature section H1 and the second low-temperature section L2 and form another thermal contact zone in the second high-temperature section H2 and the first low-temperature section L1. In this way, heat exchange may be performed between the first high-temperature section H1 and the second low-temperature section L2, and heat exchange may also be performed between the second high-temperature section H2 and the first low-temperature section L1. By combining multiple independent loops by the aforementioned means, a temperature equalization effect is provided to the entire multi-loop cycling heat dissipation module 100. A temperature drop of each loop is slowed down, and an additional heat dissipation path is provided to the first high-temperature section H1 and the second high-temperature section H2. As such a temperature difference between the multi-loop cycling heat dissipation module 100 and the external environment is produced (equivalent to increasing temperature difference regions between the multi-loop cycling heat dissipation module 100 and the external environment), so that the multi-loop cycling heat dissipation module 100 may easily dissipate the heat generated by the heat source 400 to the external environment.

In this embodiment, a flow direction of the first working fluid F1 in the first loop P1 and a flow direction of the second working fluid F2 in the second loop P2 are opposite to each other. The first loop P1 and the second loop P2 are independent of each other and present inner and outer closed contours, so that the high- and low-temperature sections of the different loops may correspond to each other. Furthermore, the multi-loop cycling heat dissipation module 100 further includes a conduction member one 150 and a conduction member two 160. The conduction member one 150 is connected between the first high-temperature section H1 and the second low-temperature section L2 to transfer the heat of the first high-temperature section H1 to the second low-temperature section L2. The conduction member two 160 is connected between the second high-temperature section H2 and the first low-temperature section L1 to transfer the heat of the second high-temperature section H2 to the first low-temperature section L1.

Herein, the conduction member one 150 and the conduction member two 160 are, for example, heat pipes or components with thermal conductivity. For example, when the multi-loop cycling heat dissipation module 100 is applied to a notebook computer, the conduction member one 150 and the conduction member two 160 may be metal structures of an apparatus body or metal back plates or metal brackets disposed on the device body to facilitate the formation of the thermal contact zones of the aforementioned high- and low-temperature sections. Certainly, in other embodiments that are not shown, the first high-temperature section H1 may also directly abut against the second low-temperature section L2 in structure, and the second high-temperature section H2 may directly abut against the first low-temperature section L1 in structure to achieve direct heat transfer. Herein, the mutual thermal contact of the high- and low-temperature sections is not limited by the disclosure.

In addition, the first tank 110 and the second tank 130 of this embodiment are an integral structure, i.e., belong to different chambers in a same structure member, and the different chambers are independent of each other and do not communicate with each other.

Figure 2:
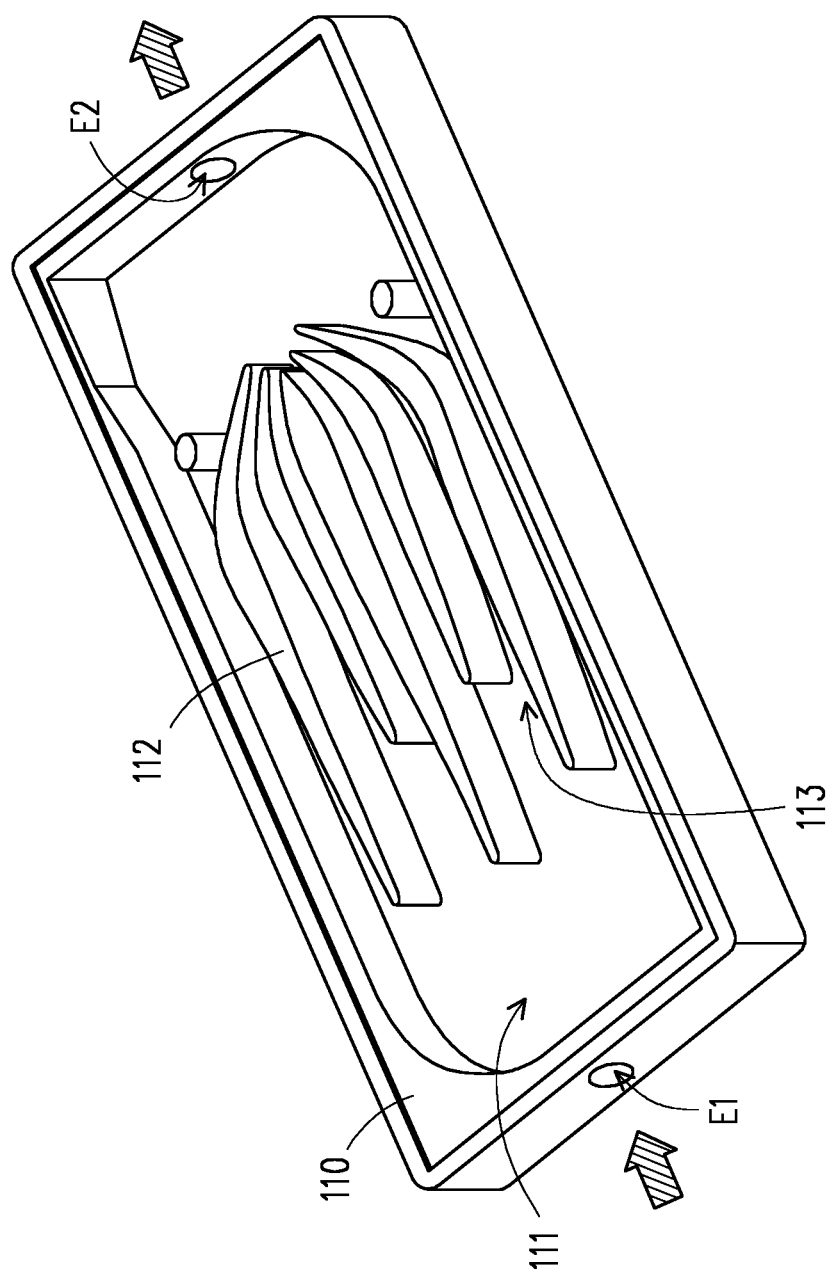
FIG. 2 is a schematic diagram of an internal structural of a tank in the heat dissipation module of FIG. 1.

FIG. 2 is a schematic diagram of an internal structural of a tank in the heat dissipation module of FIG. 1. Taking the first tank 110 as an example herein, the second tank 130 also has the same internal structure, so that description thereof is omitted. In this embodiment, the first tank 110 has a chamber 111 and a plurality of flow guiding members 112 arranged in the chamber 111. The chamber 111 has an inlet E1 and an outlet E2, and the flow guiding members 112 present a tapered profile from the inlet E1 to the outlet E2. Alternatively, the flow guiding members 112 form a plurality of flow channels 113 tapered from the inlet E1 to the outlet E2 in the chamber 111, so as to correspondingly control the first working fluid F1 and the second working fluid F2 to flow from the inlet E1 to the outlet E2. In other words, the arrangement of the flow guiding members 112 in the chamber 111 may affect a flow direction of the working fluid (taking the first working fluid F1 as an example) in the loop. Therefore, by adjusting the first tank 110 and the second tank 130 in the disclosure, the first loop P1 and the second loop P2 are formed the arrangement state shown in FIG. 1, so as to achieve the corresponding effect required by the high- and low-temperature sections.

Figure 3:
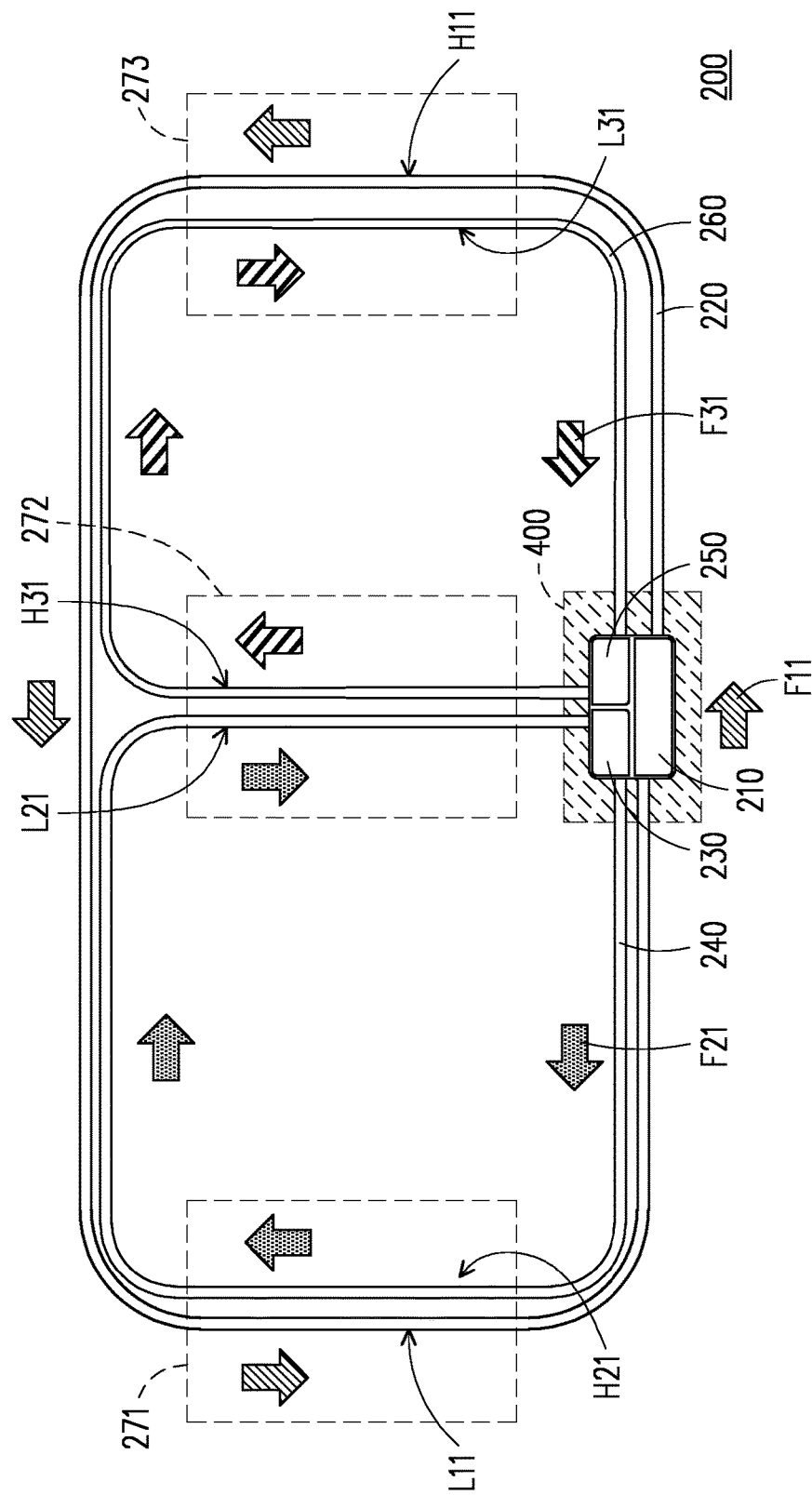
FIG. 3 is a schematic diagram of a multi-loop cycling heat dissipation module according to another embodiment of the disclosure.

FIG. 3 is a schematic diagram of a multi-loop cycling heat dissipation module according to another embodiment of the disclosure. Referring to FIG. 3, in this embodiment, a multi-loop cycling heat dissipation module 200 includes a first tank 210, a first pipe 220, a second tank 230, a second pipe 240, a third tank 250, and a third pipe 260. The first tank 210 is connected to the first pipe 220 to form a first loop P11, the second tank 230 is connected to the second pipe 240 to form a second loop P21, and the third tank 250 is connected to the third pipe 260 to form a third loop P31. A first working fluid F11 fills the first loop P11, a second working fluid F21 fills the second loop P21, and a third working fluid F31 fills the third loop P31.

With the same logic as the pervious embodiments, in this embodiment, different independent loops are combined, and thermal contact is provided between the high- and low-temperature sections to facilitate heat transfer. Accordingly, a first high-temperature section H11 of the first pipe 220 is in thermal contact with a third low-temperature section L31 of the third pipe 260, a first low-temperature section L11 of the first pipe 220 is in thermal contact with a second high-temperature section H21 of the second pipe 240, and a third high-temperature section H31 of the third pipe 260 is in thermal contact with a second low-temperature section L21 of the second pipe 240. In other words, as shown in FIG. 3, the first loop P11, the second loop P21, and the third loop P31 form three thermal contact zones 271-273, and these thermal contact zones 271-273 are the same as the thermal contact zones described in the above embodiments. Connection may be made through direct structural contact or through a thermal contact member to achieve the effect of transferring heat from the high-temperature section to the low-temperature section.

The first tank 210, the second tank 230, and the third tank 250 are an integral structure. A flow direction of the first working fluid F11 in the first loop P11 and a flow direction of the second working fluid F21 in the second loop P21 are opposite to each other, and the flow direction of the first working fluid F11 in the first loop P11 and a flow direction of the third working fluid F31 in the third loop P31 are opposite to each other. As such, the second loop P21 and the third loop P31 are independent of and separated from each other and are both surrounded by the first loop P11.

Figure 4:
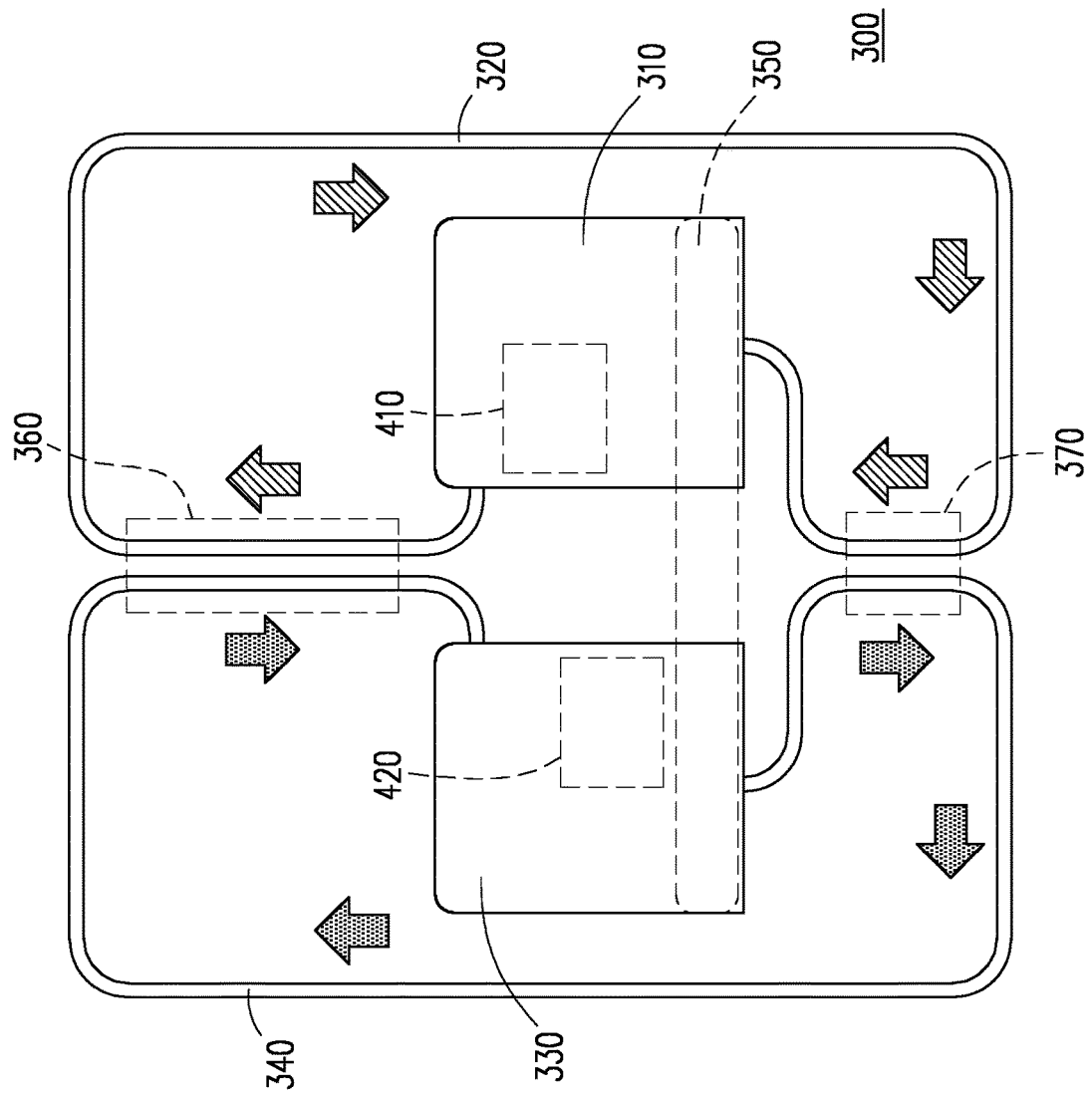
FIG. 4 is a schematic diagram of a multi-loop cycling heat dissipation module according to another embodiment of the disclosure.

FIG. 4 is a schematic diagram of a multi-loop cycling heat dissipation module according to another embodiment of the disclosure. A difference between the aforementioned embodiments and this embodiment is that in a multi-loop cycling heat dissipation module 300 of the embodiment, a first tank 310 and a second tank 330 are structures separated from each other, and a first pipe 320 and a second pipe 340 are also separated from each other and paralleled to each other at the same time, and flow directions of the working fluids in the different loops are the same with each other. In other words, in this embodiment, the first tank 310, the first pipe 320, and the working fluid filling therein are used to dissipate heat of a heat source 410. The second tank 330, the second pipe 340, and the working fluid filling therein are used to dissipate heat of a heat source 420. Meanwhile, the first tank 310 and the second tank 330 are further connected by a conduction member three 350 to achieve a heat transfer effect therebetween. More importantly, the first pipe 320 and the second pipe 340 also have thermal contact zones 360 and 370 for high- and low-temperatures sections. In brief, the independent loops shown in the multi-loop cycling heat dissipation module 300 of the embodiment may simultaneously achieve heat exchange through the conduction member three 350 and the thermal contact zones 360 and 370. The aforementioned temperature equalization effect and overall heat dissipation capacity are thereby achieved.

It should also be noted that in the tanks, the flow guiding members 112 shown in FIG. 2 may be applied in all embodiments shown in FIG. 1, FIG. 3, and FIG. 4 to make the flow directions of the working fluids flowing in the loops meet the needs.

In view of the foregoing, the heat dissipation module of the disclosure is formed by multi-loop cycling arrangement and is filled with corresponding working fluids so that these loops are independent single loops. More importantly, in the independent loops, the heat dissipation module of the disclosure further combines the high-temperature sections and the low-temperature sections of the pipes by means of thermal contact. Accordingly, the high-temperature section of one loop may further transfer heat to the low-temperature section of another loop. In this way, an additional heat dissipation path is provided, and the temperature equalization effect is also provided to the entire heat dissipation module, so that the overall heat dissipation capacity of the heat dissipation module is effectively improved. In other words, by slowing down the temperature dropping degree of a single loop and providing the additional heat dissipation path, the overall heat dissipation performance of the heat dissipation module is improved accordingly, the heat generated by the heat source of the electronic apparatus is quickly transferred to the external environment, and heat is prevented from accumulating on a local part of the electronic apparatus.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A multi-loop cycling heat dissipation module, comprising:
   a first tank;
   a first pipe, connected to the first tank to form a first loop, wherein a first working fluid fills the first loop to transfer heat via phase transformation, and a first high-temperature section and a first low-temperature section are formed on the first pipe;
   a second tank;
   a second pipe, connected to the second tank to form a second loop, wherein a second working fluid fills the second loop to transfer heat via phase transformation, and a second high-temperature section and a second low-temperature section are formed on the second pipe;
   a conduction member, connected between the first high-temperature section and the second low-temperature section to transfer heat of the first high-temperature section to the second low-temperature section; and
   another conduction member, connected between the second high-temperature section and the first low-temperature section to transfer heat of the second high-temperature section to the first low-temperature section, wherein the first high-temperature section is in thermal contact with the second low-temperature section, and the first low-temperature section is in thermal contact with the second high-temperature section, wherein the first high-temperature section abuts against the second low-temperature section in structure, and the second high-temperature section abuts against the first low-temperature section in structure,
   wherein each of the first tank and the second tank respectively has a chamber and a plurality of flow guiding members arranged in each chamber, each chamber has an inlet and an outlet, and the flow guiding members are protruded sections in each of each chamber that form flow channels with tapered profile from the inlet to the outlet, so as to correspondingly control the first working fluid and the second working fluid to flow from the inlet to the outlet, wherein the protruded sections are arranged laterally and next to each other at middle and outer sides and therebetween, and each extends from the inlet toward the outlet, starting ends of the protruded sections located at middle and outer sides of the chamber are closer to the inlet than starting ends of the protruded sections located therebetween, terminal ends of the protruded sections come together to be adjacent with each other, each of the protruded sections has a thickness increasing and then decreasing on a direction from the inlet to the outlet, and a dimension of an entrance of each flow channel is greater than a dimension of an exit of each flow channel so as to speed up the first working fluid in the first tank and the second working fluid in the second tank.

2. The multi-loop cycling heat dissipation module according to claim 1, wherein a flow direction of the first working fluid in the first loop and a flow direction of the second working fluid in the second loop are opposite to each other.

3. The multi-loop cycling heat dissipation module according to claim 1, wherein the first loop and the second loop are independent of each other and the first loop and second loop each presents a closed contour where the first loop is an inner loop and the second loop is an outer loop.

4. The multi-loop cycling heat dissipation module according to claim 1, wherein the first tank and the second tank are an integral structure.

\* \* \* \* \*